(12) United States Patent
Chuang (10) Patent No.: US 12,211,813 B2
(45) Date of Patent: Jan. 28, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 479 days.

(21) Appl. No.: 17/648,307

(22) Filed: Jan. 19, 2022

(65) Prior Publication Data
US 2023/0005866 A1 Jan. 5, 2023

Related U.S. Application Data

(63) Continuation of application No. PCT/CN2021/117526, filed on Sep. 9, 2021.

(30) Foreign Application Priority Data

Jul. 1, 2021 (CN) .......................... 202110744579.2

(51) Int. Cl.
*H01L 23/00* (2006.01)
*H01L 23/48* (2006.01)

(52) U.S. Cl.
CPC ............ *H01L 24/08* (2013.01); *H01L 23/481* (2013.01); *H01L 24/05* (2013.01); *H01L 24/80* (2013.01);
(Continued)

(58) Field of Classification Search
CPC . H01L 2224/05109; H01L 2224/05113; H01L 2224/05147; H01L 2224/05184;
(Continued)

(56) References Cited

U.S. PATENT DOCUMENTS 7,213,978 B2 * 5/2007 Kuhmann .............. G02B 6/423
385/52
7,679,591 B2 * 3/2010 Hu ........................ H10K 50/841
313/512
(Continued)

FOREIGN PATENT DOCUMENTS

| CN | 105448862 A | 3/2016 |
| CN | 109243974 A | 1/2019 |

(Continued)

OTHER PUBLICATIONS

International Search Report cited in PCT/CN2021/117526 mailed Mar. 29, 2022, 9 pages.

*Primary Examiner* — Ratisha Mehta
(74) *Attorney, Agent, or Firm* — Syncoda LLC; Feng Ma (57) ABSTRACT

The present disclosure relates to the technical field of semiconductors, and provides a semiconductor structure and a manufacturing method thereof. The semiconductor structure includes a first chip and a second chip, where a first conductive connection wire of the first chip is connected to a first conductive contact pad, a second conductive connection wire of the second chip is connected to a second conductive contact pad, the first conductive contact pad includes a first conductor group and a first connection group, and the second conductive contact pad includes a second conductor group and a second connection group.

19 Claims, 5 Drawing Sheets

(52) U.S. Cl.
CPC ............... *H01L 2224/05076* (2013.01); *H01L 2224/05101* (2013.01); *H01L 2224/05109* (2013.01); *H01L 2224/05111* (2013.01); *H01L 2224/05113* (2013.01); *H01L 2224/05116* (2013.01); *H01L 2224/05138* (2013.01); *H01L 2224/05147* (2013.01); *H01L 2224/05184* (2013.01); *H01L 2224/08145* (2013.01); *H01L 2224/8012* (2013.01); *H01L 2224/80895* (2013.01); *H01L 2224/80896* (2013.01); *H01L 2924/01029* (2013.01); *H01L 2924/01048* (2013.01); *H01L 2924/01049* (2013.01); *H01L 2924/0105* (2013.01); *H01L 2924/01066* (2013.01); *H01L 2924/01074* (2013.01); *H01L 2924/01082* (2013.01); *H01L 2924/01083* (2013.01); *H01L 2924/05042* (2013.01); *H01L 2924/0509* (2013.01); *H01L 2924/05442* (2013.01); *H01L 2924/0549* (2013.01)

(58) Field of Classification Search
CPC ........ H01L 24/08; H01L 23/481; H01L 24/05; H01L 24/80; H01L 2224/05076; H01L 2224/05101; H01L 2224/05111; H01L 2224/05116
See application file for complete search history.

(56) References Cited

U.S. PATENT DOCUMENTS

| | | | |
|---|---|---|---|
| 9,269,878 B2 * | 2/2016 | Hwang | H01L 33/405 |
| 9,754,893 B2 | 9/2017 | Ding et al. | |
| 10,129,988 B2 * | 11/2018 | Chen | H05K 1/111 |
| 10,211,366 B2 * | 2/2019 | Wu | H01L 33/62 |
| 2010/0032827 A1 * | 2/2010 | Hsu | H01L 24/25 |
| | | | 257/692 |
| 2010/0177031 A1 * | 7/2010 | Fan | G02F 1/133308 |
| | | | 156/60 |
| 2014/0048129 A1 * | 2/2014 | Chen | H01L 31/0682 |
| | | | 438/72 |
| 2018/0047884 A1 * | 2/2018 | Oh | H01L 33/54 |
| 2019/0181317 A1 * | 6/2019 | Yu | H01L 25/0753 |
| 2019/0279936 A1 * | 9/2019 | Lin | H01L 23/5385 |
| 2019/0326336 A1 * | 10/2019 | Xi | H01L 27/1288 |
| 2019/0377453 A1 * | 12/2019 | Yang | G06F 3/04164 |
| 2020/0020672 A1 * | 1/2020 | Xi | H01L 27/1214 |
| 2020/0135657 A1 * | 4/2020 | Wang | H01L 23/552 |

FOREIGN PATENT DOCUMENTS

| | | |
|---|---|---|
| CN | 109755142 A | 5/2019 |
| CN | 210328151 U | 4/2020 |
| WO | 2013127045 A1 | 9/2013 |

* cited by examiner

SEMICONDUCTOR STRUCTURE AND MANUFACTURING METHOD THEREOF

CROSS-REFERENCE TO RELATED APPLICATIONS

This is a continuation of International Patent Application No. PCT/CN2021/117526, filed on Sep. 9, 2021, which claims the priority to Chinese Patent Application No. 202110744579.2, titled "SEMICONDUCTOR STRUCTURE AND MANUFACTURING METHOD THEREOF and filed on Jul. 1, 2021. The entire contents of" International Patent Application No. PCT/CN2021/117526 and Chinese Patent Application No. 202110744579.2 are incorporated herein by reference.

TECHNICAL FIELD

The present disclosure relates to the technical field of semiconductors, and in particular to a semiconductor structure and a manufacturing method thereof.

BACKGROUND

In the related art, chips are bonded through interconnection of metal pads on the chips. The stacked chips need to be transferred before bonding, and if there is vibration or external force influence, the stacked chips cannot be aligned due to slippage, which may increase the manufacturing difficulty.

SUMMARY

The present disclosure provides a semiconductor structure and a manufacturing method thereof, to improve the performance of the semiconductor structure.

According to a first aspect of the present disclosure, a semiconductor structure is provided, including:

a first chip, where the first chip includes a first substrate, a first conductive connection wire, and a first conductive contact pad, the first conductive contact pad is connected to the first conductive connection wire, the first conductive contact pad includes a first conductor group and a first connection group, and a melting point of the first conductor group is higher than a melting point of the first connection group; and a second chip, where the second chip includes a second substrate, a second conductive connection wire, and a second conductive contact pad, the second conductive contact pad is connected to the second conductive connection wire, the second conductive contact pad includes a second conductor group and a second connection group, a melting point of the second conductor group is higher than a melting point of the second connection group, the first conductor group is directly opposite to the second conductor group, and the first connection group is directly opposite to the second connection group, such that a bonding structure is formed between the first conductive contact pad and the second conductive contact pad;

where an end of the first conductive contact pad facing toward the second conductive contact pad is a first contact surface, an end of the second conductive contact pad facing toward the first contact surface is a second contact surface, an area occupied by the first conductor group on the first contact surface is larger than an area occupied by the first connection group on the first contact surface, and an area occupied by the second conductor group on the second contact surface is larger than an area occupied by the second connection group on the second contact surface.

According to a second aspect of the present disclosure, a method of manufacturing a semiconductor structure is provided, including:

providing a first chip, where the first chip includes a first substrate, a first conductive connection wire, and a first conductive contact pad, the first conductive contact pad is connected to the first conductive connection wire, the first conductive contact pad includes a first conductor group and a first connection group, and a melting point of the first conductor group is higher than a melting point of the first connection group; and providing a second chip, where the second chip comprises a second substrate, a second conductive connection wire, and a second conductive contact pad, the second conductive contact pad is connected to the second conductive connection wire, the second conductive contact pad includes a second conductor group and a second connection group, and a melting point of the second conductor group is higher than a melting point of the second connection group;

aligning the first chip with the second chip, such that the first conductor group is directly opposite to the second conductor group, and the first connection group is directly opposite to the second connection group; and connecting the first chip and the second chip;

where an end of the first conductive contact pad facing toward the second conductive contact pad is a first contact surface, an end of the second conductive contact pad facing toward the first contact surface is a second contact surface, an area occupied by the first conductor group on the first contact surface is larger than an area occupied by the first connection group on the first contact surface, and an area occupied by the second conductor group on the second contact surface is larger than an area occupied by the second connection group on the second contact surface.

BRIEF DESCRIPTION OF THE DRAWINGS

The preferred embodiments of the present disclosure are described in detail below with reference to the accompanying drawings to make the objectives, features and advantages of the present disclosure more obvious. The drawings are merely exemplary illustrations of the present disclosure, and are not necessarily drawn to scale. The same reference numerals in the drawings always represent the same parts. In the drawings.

DETAILED DESCRIPTION

The typical embodiments embodying the features and advantages of the present disclosure are described in detail below. It should be understood that the present disclosure may have various changes in different embodiments, which do not depart from the scope of the present disclosure. The description and drawings herein are essentially used for the purpose of explanation, rather than limiting the present disclosure.

Different exemplary embodiments of the present disclosure are described below with reference to the accompanying drawings. The accompanying drawings form a part of the present disclosure, which show by way of example different exemplary structures, systems and steps that can implement various aspects of the present disclosure. It should be understood that other specific solutions of components, structures, exemplary devices, systems and steps may be used, and structural and functional modifications may be made without departing from the scope of the present disclosure. Moreover, although the terms such as "above", "between" and "within" may be used in this specification to describe different exemplary features and elements of the present disclosure, these terms are used herein only for convenience of description, for example, according to the directions of the examples in the drawings. Nothing in this specification should be understood as requiring a specific three-dimensional direction of the structure to fall within the scope of the present disclosure.

Figure 1:
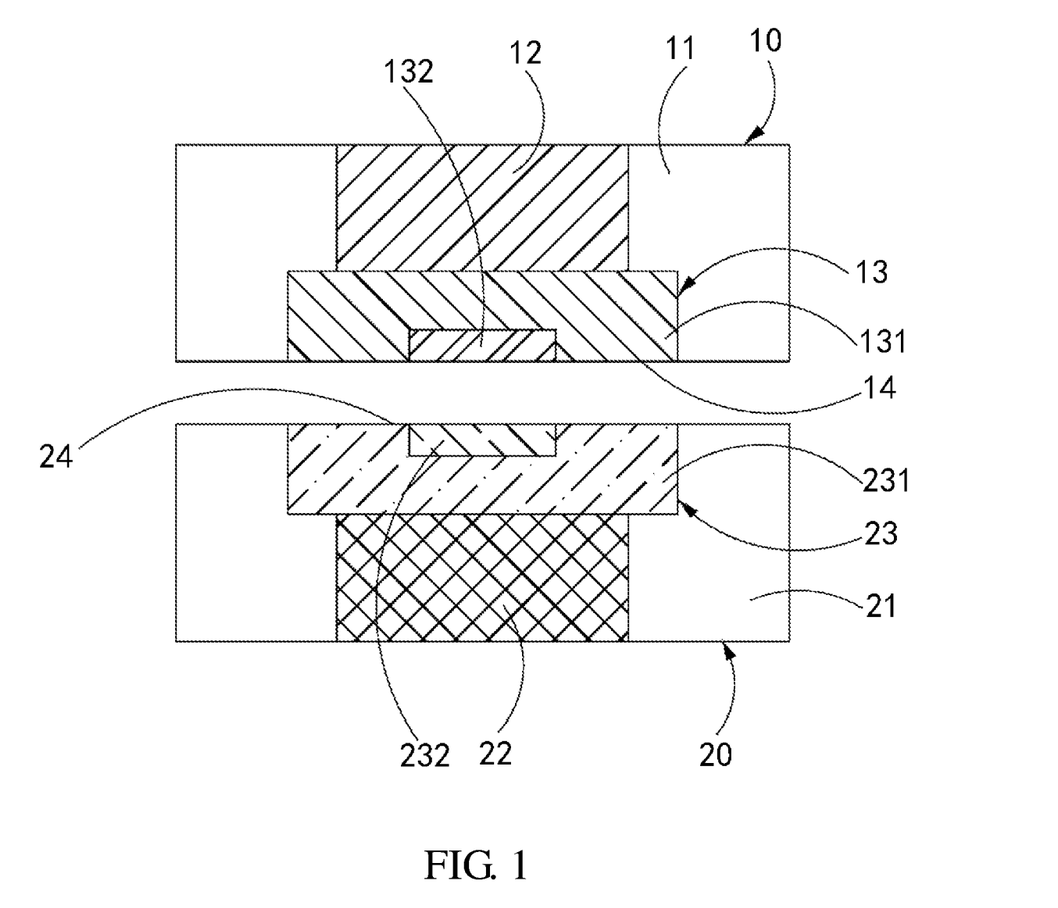
FIG. 1 is an exploded schematic structural diagram of a first chip and a second chip of a semiconductor structure according to an exemplary implementation.
Figure 2:
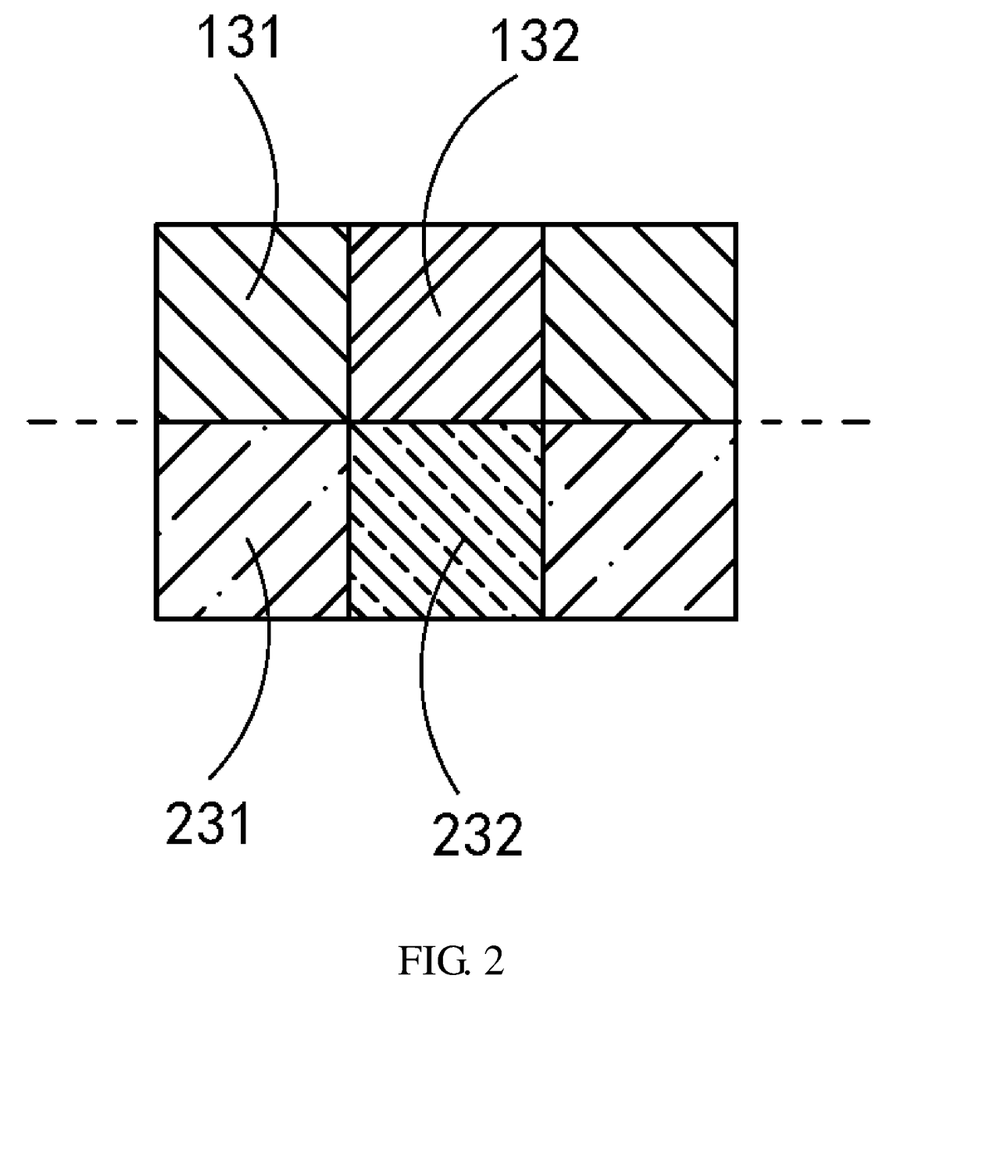
FIG. 2 is a schematic structural diagram of partially connected first chip and second chip of a semiconductor structure according to an exemplary implementation.

An embodiment of the present disclosure provides a semiconductor structure. Referring to FIG. 1 and FIG. 2, the semiconductor structure includes: a first chip 10, where the first chip 10 includes a first substrate 11, a first conductive connection wire 12, and a first conductive contact pad 13, the first conductive contact pad 13 is connected to the first conductive connection wire 12, the first conductive contact pad 13 includes a first conductor group 131 and a first connection group 132, and a melting point of the first conductor group 131 is higher than that of the first connection group 132; and a second chip 20, where the second chip 20 includes a second substrate 21, a second conductive connection wire 22, and a second conductive contact pad 23, the second conductive contact pad 23 is connected to the second conductive connection wire 22, the second conductive contact pad 23 includes a second conductor group 231 and a second connection group 232, a melting point of the second conductor group 231 is higher than that of the second connection group 232, the first conductor group 131 is directly opposite to the second conductor group 231, and the first connection group 132 is directly opposite to the second connection group 232, such that a bonding structure is formed between the first conductive contact pad 13 and the second conductive contact pad 23. An end of the first conductive contact pad 13 facing toward the second conductive contact pad 23 is a first contact surface 14, an end of the second conductive contact pad 23 facing toward the first contact surface 14 is a second contact surface 24, an area occupied by the first conductor group 131 on the first contact surface 14 is larger than an area occupied by the first connection group 132 on the first contact surface 14, and an area occupied by the second conductor group 231 on the second contact surface 24 is larger than an area occupied by the second connection group 232 on the second contact surface 24.

The semiconductor structure according to an embodiment of the present disclosure includes the first chip 10 and the second chip 20. The first conductive connection wire 12 of the first chip 10 is connected to the first conductive contact pad 13; the second conductive connection wire 22 of the second chip 20 is connected to the second conductive contact pad 23; the first conductive contact pad 13 includes the first conductor group 131 and the first connection group 132, and the second conductive contact pad 23 includes the second conductor group 231 and the second connection group 232. The first conductor group 131 is directly opposite to the second conductor group 231, the first connection group 132 is directly opposite to the second connection group 232, the melting point of the first conductor group 131 is higher than that of the first connection group 132, and the melting point of the second conductor group 231 is higher than that of the second connection group 232. Therefore, the first connection group 132 and the second connection group 232 can be melted and connected at a first temperature, thus implementing a pre-connection between the first conductive contact pad 13 and the second conductive contact pad 23. Then, the pre-connected first chip 10 and second chip 20 are transferred to an annealing condition at a second temperature for bonding, to achieve reliable bonding between the first conductive contact pad 13 and the second conductive contact pad 23. Because the first chip 10 and the second chip 20 have been pre-connected before being transferred, relative movement between the first chip 10 and the second chip 20 is avoided, which ensures the subsequent alignment of the first chip 10 and the second chip 20 to be reliable, thereby improving the performance of the semiconductor structure.

It should be noted that, at the first temperature, the first connection group 132 and the second connection group 232 are melted, while the first conductor group 131 and the second conductor group 231 are not melted. In this case, the first connection group 132 and the second connection group 232 can be connected, and various materials of the first conductive contact pad 13 and the second conductive contact pad 23 can be interpenetrated and fused. As shown in FIG. 2, a compound is thus formed, thereby implementing the pre-connection between the first conductive contact pad 13 and the second conductive contact pad 23. Because the first conductive contact pad 13 and the second conductive contact pad 23 are pre-connected, relative slippage of the first chip 10 and the second chip 20 is avoided in the subsequent process of transferring the first chip 10 and the second chip 20, ensuring that the first chip 10 and the second chip 20 are bonded under the annealing condition at the second temperature while the first chip 10 and the second chip 20 are connected with reliable alignment. Therefore, the first conductive contact pad 13 and the second conductive contact pad 23 are bonded reliably, and a reliable bonding structure is formed between the first conductive contact pad 13 and the second conductive contact pad 23. In the related art, the first chip 10 and the second chip 20 are directly placed in a high-temperature environment for bonding, and the alignment is affected by the slippage during the transfer process, thus affecting the performance of the semiconductor structure. The semiconductor structure in this embodiment can improve the alignment in the related art, such that the performance of the semiconductor structure is improved.

Various elements in the first connection group 132 and the second connection group 232 may not be fused with the first conductor group 131 and the second conductor group 231, provided that the first connection group 132 and the second connection group 232 are melted and connected, which can also ensure the pre-connection between the first chip 10 and the second chip 20.

The first conductor group 131 is directly opposite to the second conductor group 231, and the first connection group 132 is directly opposite to the second connection group 232, which actually indicates the positional relationship between the first chip 10 and the second chip 20 before bonding. After bonding, that is, when the bonding structure is formed between the first conductive contact pad 13 and the second conductive contact pad 23, the foregoing positional relationship does not necessarily exist. It is possible that a corresponding positional relationship of the materials cannot be determined due to the fusion of the materials, but the foregoing positional relationship can be determined based on the material configuration.

In some embodiments, the first connection group 132 and the second connection group 232 may include metal conductive materials, such as bismuth, cadmium, tin, lead, dysprosium and indium, and the metal conductive materials can be fused with the first conductor group 131 and the second conductor group 231, to form metal compounds. Alternatively, the first connection group 132 and the second connection group 232 may be non-metal materials, such as silicon dioxide ($SiO_2$), silicon oxide carbon (SiOC), silicon nitride (SiN), silicon carbon nitride (SiCN).

In some embodiments, the first conductive connection wire 12 and the first conductive contact pad 13 are both located in the first substrate 11; the second conductive connection wire 22 and the second conductive contact pad 23 are both located in the second substrate 21.

Alternatively, the first conductive connection wire 12 and the first conductive contact pad 13 may be partially located in the first substrate 11, or the first conductive connection wire 12 and the first conductive contact pad 13 may be completely located in the first substrate 11. Correspondingly, the second conductive connection wire 22 and the second conductive contact pad 23 may be partially located in the second substrate 21, or may be completely located in the second substrate 21.

In some embodiments, the first conductive contact pad 13 may be located on the surface of the first substrate 11. Correspondingly, the second conductive contact pad 23 may be located on the surface of the second substrate 21.

It should be noted that, after bonding of the first chip 10 and the second chip 20, the first substrate 11 and the second substrate 21 are bonded. The first substrate 11 includes a silicon substrate and an insulating layer formed above the silicon substrate. A part of the first conductive connection wire 12 is located in the insulating layer, and the first conductive contact pad 13 is formed in the insulating layer. Correspondingly, the second substrate 21 includes a silicon substrate and an insulating layer formed above the silicon substrate. A part of the second conductive connection wire 22 is located in the insulating layer, and the second conductive contact pad 23 is formed in the insulating layer. During bonding of the first chip 10 and the second chip 20, the first conductive contact pad 13 and the second conductive contact pad 23 are bonded, while the insulating layers of the first chip 10 and the second chip 20 are bonded.

Specifically, the silicon substrate may be made of a silicon-containing material. The silicon substrate may be made of any suitable material, including, for example, at least one of silicon, monocrystalline silicon, polysilicon, amorphous silicon, silicon-germanium, monocrystalline silicon-germanium, polycrystalline silicon-germanium, or carbon-doped silicon.

The insulating layer may include silicon dioxide ($SiO_2$), silicon oxide carbon (SiOC), silicon nitride (SiN), silicon carbon nitride (SiCN), or other related integrated-circuit insulating materials.

In an embodiment, the first conductive connection wire 12 is a first through-silicon via; the second conductive connection wire 22 is a second through-silicon via. The first through-silicon via and the second through-silicon via are connected through the first conductive contact pad 13 and the second conductive contact pad 23.

In an embodiment, a thickness of the first connection group 132 is less than 1 um, and a thickness of the second connection group 232 is less than 1 um.

With reference to FIG. 1, an end of the first conductive contact pad 13 facing toward the second conductive contact pad 23 is a first contact surface 14, and an end of the second conductive contact pad 23 facing toward the first contact surface 14 is a second contact surface 24. The first conductor group 131 and the first connection group 132 each occupy a part of the first contact surface 14; the second conductor group 231 and the second connection group 232 each occupy a part of the second contact surface 24. An area occupied by the first conductor group 131 on the first contact surface 14 is larger than an area occupied by the first connection group 132 on the first contact surface 14, and an area occupied by the second conductor group 231 on the second contact surface 24 is larger than an area occupied by the second connection group 232 on the second contact surface 24. During bonding of the first chip 10 and the second chip 20, the first contact surface 14 and the second contact surface 24 are connected to each other, so as to implement an electrical connection between the first conductive contact pad 13 and the second conductive contact pad 23.

It should be noted that, the first connection group 132 and the second connection group 232 may be insulators. When the insulating layer of the first chip 10 is bonded with the insulating layer of the second chip 20, the first connection group 132 and the second connection group 232 will also be bonded, and the bonding temperature is relatively low. The bonding between the insulating layers and the bonding between the first connection group 132 and the second connection group 232 can implement bonding and forming with one step, thus reducing bonding steps. Further, the first connection group 132 and the second connection group 232 have the same bonding temperature and are made of the same material. In some embodiments, the first connection group 132 and the second connection group 232 have the same bonding temperature and are made of the same material as the insulating layer of the first chip 10 and the insulating layer of the second chip 20.

In this case, the first connection group 132 and the second connection group 232 may be only used for the pre-connection purpose, while the electrical connection between the first conductive contact pad 13 and the second conductive contact pad 23 relies on the connection between the first conductor group 131 and the second conductor group 231. Therefore, in order to ensure a good conductive connection between the first conductive contact pad 13 and the second conductive contact pad 23, the area occupied by the first conductor group 131 on the first contact surface 14 is larger than the area occupied by the first connection group 132 on the first contact surface 14, and the area occupied by the second conductor group 231 on the second contact surface 24 is larger than the area occupied by the second connection group 232 on the second contact surface 24.

In some embodiments, the first conductor group 131 and the first connection group 132 occupy a part of the first contact surface 14, that is, the first conductive contact pad 13 may further include other conductors. Correspondingly, the second conductor group 231 and the second connection group 232 occupy a part of the second contact surface 24, and the second conductive contact pad 23 may further include other conductors. The melting points of other conductors of the first conductive contact pad 13 and the second conductive contact pad 23 are not limited. The present disclosure focuses on the implementation of the pre-connection between the first chip 10 and the second chip 20 at a relatively low temperature by limiting the relationship between the melting points of the first conductor group 131 and first connection group 132 as well as the relationship between the melting points of the second conductor group 231 and the second connection group 232.

In some embodiments, the first conductor group 131 and the first connection group 132 occupy the entire first contact surface 14, that is, the first conductive contact pad 13 may include only the first conductor group 131 and the first connection group 132. Alternatively, the first conductive contact pad 13 may include another conductor, but the conductor is not located at an end of the first conductive contact pad 13 which is away from the first conductive connection wire 12. Correspondingly, the second conductor group 231 and the second connection group 232 occupy the entire second contact surface 24, that is, the second conductive contact pad 23 may include only the second conductor group 231 and the second connection group 232. Alternatively, the second conductive contact pad 23 may include another conductor, but the conductor is not located at an end of the second conductive contact pad 23 which is away from the second conductive connection wire 22.

In an embodiment, the first conductor group 131 may include multiple conductive materials, that is, the first conductor group 131 may consist of a combination of different types of conductive materials. The different types of conductive materials herein are different from one metal compound, that is, the first conductor group 131 may include multiple single metal materials, or multiple metal compounds, or a combination of a single metal material and a metal compound. Correspondingly, for the second conductor group 231, reference may be made to this embodiment, and details are not described herein again.

The first connection group 132 may include multiple conductive materials and/or insulating materials. That is, the first connection group 132 may consist of a combination of different types of materials. The different types of materials herein are different from one compound, that is, the first connection group 132 may include multiple single materials, or multiple compounds, or a combination of a single material and a compound. Correspondingly, for the second connection group 232, reference may be made to this embodiment, and details are not described herein again.

In an embodiment, the first conductor group 131 includes only a first conductor, and the first connection group 132 includes at least one of the second conductor or the first insulator; the second conductor group 231 includes a third conductor, and the second connection group 232 includes at least one of a fourth conductor or a second insulator.

In an embodiment, an area of the first contact surface 14 is equal to that of the second contact surface 24, that is, an area of a fusion surface of the first chip 10 is equal to that of a fusion surface of the second chip 20. When the first conductor group 131 and the first connection group 132 occupy the entire first contact surface 14, and the second conductor group 231 and the second connection group 232 occupy the entire second contact surface 24, the area occupied by the first conductor group 131 on the first contact surface 14 is equal to the area occupied by the second conductor group 231 on the second contact surface 24, and the area occupied by the first connection group 132 on the first contact surface 14 is equal to the area occupied by the second connection group 232 on the second contact surface 24, to ensure that the first conductor group 131 is directly opposite to the second conductor group 231, and the first connection group 132 is directly opposite to the second connection group 232.

In some embodiments, when the area of the first contact surface 14 is equal to the area of the second contact surface 24, the first conductor group 131 and the first connection group 132 occupy a part of the first contact surface 14, and the second conductor group 231 and the second connection group 232 occupy a part of the second contact surface 24, it can be ensured that the first conductor group 131 is directly opposite to the second conductor group 231, and the first connection group 132 is directly opposite to the second connection group 232, while other conductors in the first conductive contact pad 13 are directly opposite to other conductors in the second conductive contact pad 23.

In an embodiment, the area of the first contact surface 14 is not equal to the area of the second contact surface 24, that is, the area of the fusion surface of the first chip 10 is not equal to that of the fusion surface of the second chip 20. When the first contact surface 14 is smaller than the area of the second contact surface 24, a part of the second contact surface 24 will be opposite to the first substrate 11. Correspondingly, when the area of the first contact surface 14 is larger than the area of the second contact surface 24, a part of the first contact surface 14 will be opposite to the second substrate 21.

It should be noted that, when the area of the first contact surface 14 is not equal to the area of the second contact surface 24, for example, when the area of the first contact surface 14 is smaller than the area of the second contact surface 24, the first conductor group 131 and the first connection group 132 may occupy the entire first contact surface 14, while the second conductor group 231 and the second connection group 232 may also occupy the entire second contact surface 24. In this case, it is only necessary to ensure that the first conductor group 131 is directly opposite to the second conductor group 231, and all of the first connection group 132 is directly opposite to the second connection group 232, while other parts including at least one of the second conductor group 231 and the second connection group 232 of the second conductive contact pad 23 may be directly corresponding to the first substrate 11. Correspondingly, when the area of the first contact surface 14 is larger than the area of the second contact surface 24, reference may be made to this embodiment, and details are not described herein again.

In an embodiment, a peripheral outer edge of the first contact surface 14 includes at least one of a straight line or a curve, and a peripheral outer edge of the second contact surface 24 includes at least one of a straight line or a curve. The shape of the first contact surface 14 and the shape of the second contact surface 24 may be completely the same or different. The shape of the first contact surface 14 and the shape of the second contact surface 24 may be a circle, an oval, a rectangle, or other shapes, which are not limited herein.

It should be noted that, when the area of the first contact surface 14 is equal to the area of the second contact surface 24, the first conductor group 131 and the first connection group 132 occupy the entire first contact surface 14, and the second conductor group 231 and the second connection group 232 occupy the entire second contact surface 24, it indicates that the shape of the first contact surface 14 is completely the same as that of the second contact surface 24, and the first contact surface 14 and the second contact surface 24 exactly overlap with each other.

In an embodiment, a volume occupied by the first conductor group 131 in the first conductive contact pad 13 is larger than a volume occupied by the first connection group 132 in the first conductive contact pad 13; a volume occupied by the second conductor group 231 in the second conductive contact pad 23 is larger than a volume occupied by the second connection group 232 in the second conductive contact pad 23. That is, materials with a low melting point account for a relatively low percentage in the first conductive contact pad 13 and the second conductive contact pad 23. During bonding of the first chip 10 and the second chip 20, the first connection group 132 and the second connection group 232 is used for ensure the pre-connection only, while the electrical connections from the first conductive contact pad 13 and the second conductive contact pad 23 to other structures mainly rely on the connection between the first conductor group 131 and the second conductor group 231.

In an embodiment, one end of the first conductive connection wire 12 is completely connected on the first conductor group 131; one end of the second conductive connection wire 22 is completely connected on the second conductor group 231. That is, the first conductive contact pad 13 includes the first connection group 132 only at an end away from the first conductive connection wire 12, and the second conductive contact pad 23 includes the second connection group 232 only at an end away from the second conductive connection wire 22.

It should be noted that, one end of the first conductive connection wire 12 is completely connected on the first conductor group 131, and one end of the second conductive connection wire 22 is completely connected on the second conductor group 231, which can be further interpreted as follows: before bonding of the first chip 10 and the second chip 20, one end of the first conductive connection wire 12 is completely connected on the first conductor group 131, and one end of the second conductive connection wire 22 is completely connected on the second conductor group 231, while after the bonding structure is formed between the first conductive contact pad 13 and the second conductive contact pad 23, there is a possibility of fusion between conductive materials; however, the foregoing structural relationship can also be determined based on the material configuration.

In an embodiment, the first connection group 132 includes multiple first sub-connection sections 1321, and a part of the first conductor group 131 is clamped between adjacent first sub-connection sections 1321. That is, the first conductor group 131 is provided with a gap on a side away from the first conductive connection wire 12, to be filled between the first sub-connection sections 1321.

In an embodiment, the second connection group 232 includes multiple second sub-connection sections 2321, and a part of the second conductor group 231 is clamped between adjacent second sub-connection sections 2321. That is, the second conductor group 231 is provided with a gap on a side away from the second conductive connection wire 22, to be filled between the second sub-connection sections 2321.

Figure 3:
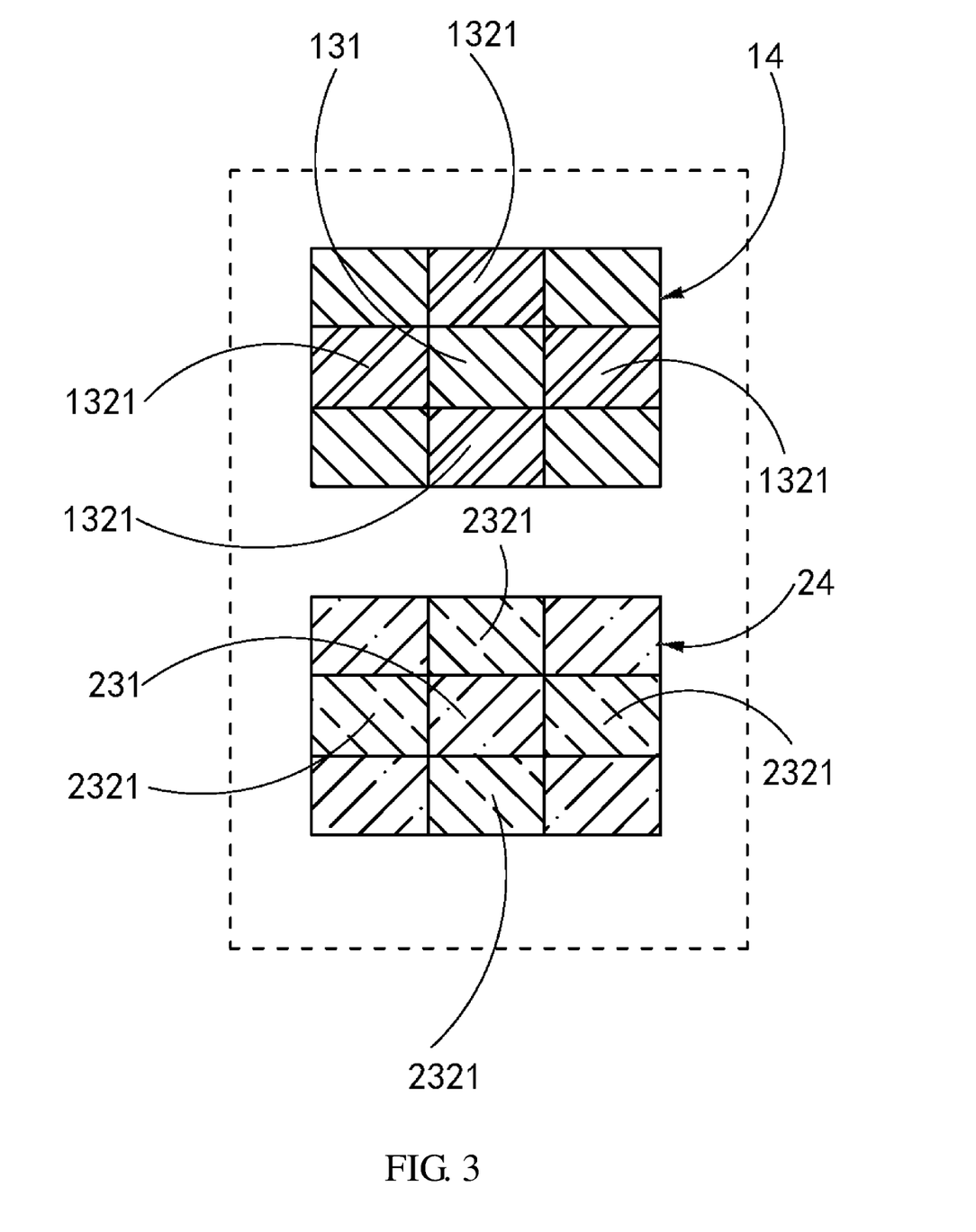
FIG. 3 is a schematic structural diagram of a first contact surface and a second contact surface of a semiconductor structure according to an exemplary implementation.

As shown in FIG. 1 and FIG. 3, the area of the first contact surface 14 is equal to the area of the second contact surface 24, the first conductor group 131 and the first connection group 132 occupy the entire first contact surface 14, and the second conductor group 231 and the second connection group 232 occupy the entire second contact surface 24; the area occupied by the first conductor group 131 on the first contact surface 14 is larger than the area occupied by the first connection group 132 on the first contact surface 14, and the area occupied by the second conductor group 231 on the second contact surface 24 is larger than the area occupied by the second connection group 232 on the second contact surface 24, so as to ensure that the first conductor group 131 is directly opposite to the second conductor group 231, and the first connection group 132 is directly opposite to the second connection group 232. The first connection group 132 includes multiple first sub-connection sections 1321, and the second connection group 232 includes multiple second sub-connection sections 2321.

Figure 4:
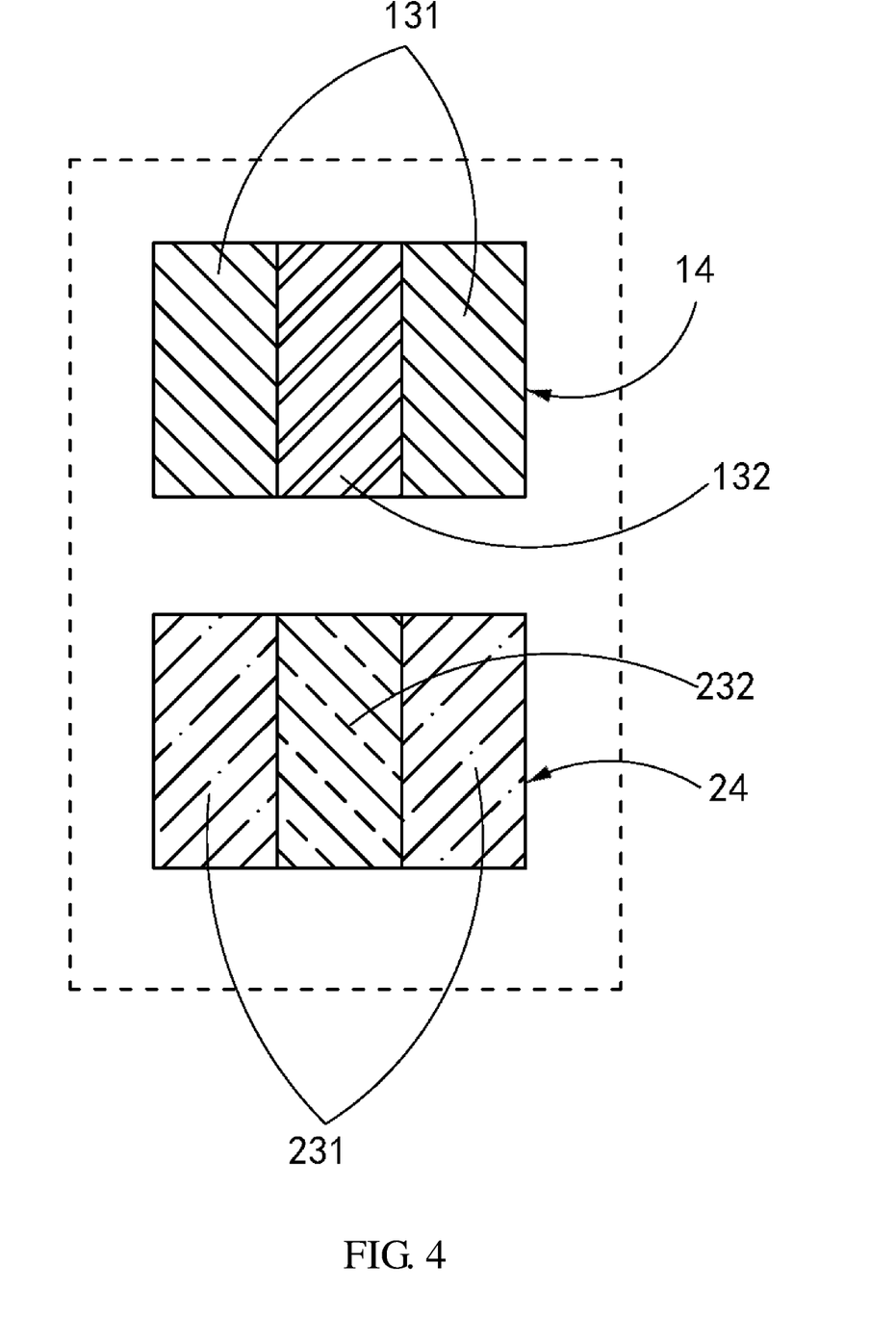
FIG. 4 is a schematic structural diagram of a first contact surface and a second contact surface of a semiconductor structure according to another exemplary implementation.

As shown in FIG. 4, the area of the first contact surface 14 is equal to the area of the second contact surface 24, the first conductor group 131 and the first connection group 132 occupy the entire first contact surface 14, and the second conductor group 231 and the second connection group 232 occupy the entire second contact surface 24; the area occupied by the first conductor group 131 on the first contact surface 14 is larger than the area occupied by the first connection group 132 on the first contact surface 14, and the area occupied by the second conductor group 231 on the second contact surface 24 is larger than the area occupied by the second connection group 232 on the second contact surface 24, so as to ensure that the first conductor group 131 is directly opposite to the second conductor group 231, and the first connection group 132 is directly opposite to the second connection group 232. The first connection group 132 is clamped in the first conductor group 131, and the second connection group 232 is clamped in the second conductor group 231.

In an embodiment, the material of the first conductor group 131 is the same as the material of the second conductor group 231, where the first conductor group 131 includes at least one of copper or tungsten, and the second conductor group 231 includes at least one of copper or tungsten. Certainly, in some embodiments, it is also possible that the first conductor group 131 and the second conductor group 231 are made of different materials with approximately the same melting point.

In an embodiment, the material of the first connection group 132 is the same as the material of the second connection group 232, where the first conductor group 131 includes at least one of copper or tungsten, and the first connection group 132 includes at least one of bismuth, cadmium, tin, lead, dysprosium or indium. Certainly, in some embodiments, it is also possible that the first connection group 132 and the second connection group 232 are made of different materials with approximately the same melting point.

In some embodiments, the material of the first connection group 132 is the same as the material of the second connection group 232, where the first conductor group 131 at least one of silicon dioxide, silicon oxide carbon, silicon nitride or silicon carbide nitride, and the second connection group 232 includes at least one of silicon dioxide, silicon oxide carbon, silicon nitride or silicon carbide nitride.

It should be noted that, the first conductor group 131 and the second conductor group 231 each may include only a single material, for example, both the first conductor group 131 and the second conductor group 231 may be copper. Alternatively, the first conductor group 131 and the second conductor group 231 each may be an alloy, such as copper-tungsten alloy. The first connection group 132 and the second connection group 232 each may include only a single material, for example, both the first connection group 132 and the second connection group 232 may be tin. Alternatively, the first connection group 132 and the second connection group 232 each may be an alloy, such as bismuth-tin, bismuth-lead, tin-indium, etc.

In an embodiment, the first conductor group 131 and the second conductor group 231 may be copper, while the first connection group 132 and the second connection group 232 may be tin. Due to the compounding effect of tin with the low melting point and the thermal expansion effect of copper, the copper surface is slightly concave and can be fused smoothly with the tin layer having the low melting point. During fusion at a low temperature (e.g., first temperature), tin (Sn) in the upper layer is directly opposite to tin in the lower layer, and copper (Cu) in the upper layer is directly opposite to copper in the lower layer. In the fusion process, tin is fused with adjacent copper, forming a $Cu_5Sn_6$ metal compound (IMC). Such a design of making the same material in the upper and lower layers opposite to each other can form a metal compound to improve the bonding strength and provide resistance against the slippage of the stacked chips (especially the alignment accuracy of the upper and lower chips) caused by an external force or movement, thus facilitating boding of the first conductive contact pad 13 and the second conductive contact pad 23 in the upper and lower layers through annealing at a relatively high temperature (e.g., second temperature), to improve the yield of the product.

In the semiconductor structure of the present disclosure, the low-melting-point metal/alloy in the upper and lower layers that are fused at a low temperature can be bonded first, and the high-strength bonding between high-melting-point metal (such as copper) can also be achieved.

Figure 5:
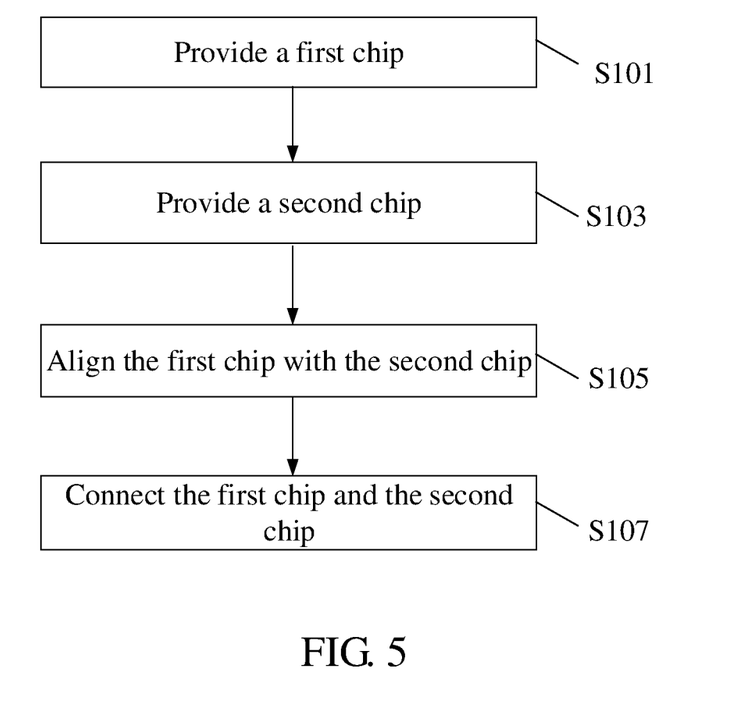
FIG. 5 is a schematic flowchart of a method of manufacturing a semiconductor structure according to an exemplary implementation.

An embodiment of the present disclosure further provides a method of manufacturing a semiconductor structure. Referring to FIG. 5, the method of manufacturing a semiconductor structure includes:

S101: Provide a first chip 10, where the first chip 10 includes a first substrate 11, a first conductive connection wire 12, and a first conductive contact pad 13, the first conductive contact pad 13 is connected to the first conductive connection wire 12, the first conductive contact pad 13 includes a first conductor group 131 and a first connection group 132, and a melting point of the first conductor group 131 is higher than that of the first connection group 132.

S103: Provide a second chip 20, where the second chip 20 includes a second substrate 21, a second conductive connection wire 22, and a second conductive contact pad 23, the second conductive contact pad 23 is connected to the second conductive connection wire 22, the second conductive contact pad 23 includes a second conductor group 231 and a second connection group 232, and a melting point of the second conductor group 231 is higher than that of the second connection group 232.

S105: Align the first chip 10 with the second chip 20, such that the first conductor group 131 is directly opposite to the second conductor group 231, and the first connection group 132 is directly opposite to the second connection group 232.

S107: Connect the first chip 10 and the second chip 20.

An end of the first conductive contact pad 13 facing toward the second conductive contact pad 23 is a first contact surface 14, an end of the second conductive contact pad 23 facing toward the first contact surface 14 is a second contact surface 24, an area occupied by the first conductor group 131 on the first contact surface 14 is larger than an area occupied by the first connection group 132 on the first contact surface 14, and an area occupied by the second conductor group 231 on the second contact surface 24 is larger than an area occupied by the second connection group 232 on the second contact surface 24.

In the method of manufacturing a semiconductor structure according to an embodiment of the present disclosure, the first conductive connection wire 12 of the first chip 10 is connected to the first conductive contact pad 13; the second conductive connection wire 22 of the second chip 20 is connected to the second conductive contact pad 23; the first conductive contact pad 13 includes the first conductor group 131 and the first connection group 132, and the second conductive contact pad 23 includes the second conductor group 231 and the second connection group 232. The first conductor group 131 is directly opposite to the second conductor group 231, the first connection group 132 is directly opposite to the second connection group 232, the melting point of the first conductor group 131 is higher than that of the first connection group 132, and the melting point of the second conductor group 231 is higher than that of the second connection group 232. Therefore, the first connection group 132 and the second connection group 232 can be melted and connected at a first temperature, thus implementing a pre-connection between the first conductive contact pad 13 and the second conductive contact pad 23. Then, the pre-connected first chip 10 and the pre-connected second chip 20 are transferred to an annealing condition at a second temperature for bonding, to achieve reliable bonding between the first conductive contact pad 13 and the second conductive contact pad 23. Because the first chip 10 and the second chip 20 have been pre-connected before being transferred, relative movement between the first chip 10 and the second chip 20 is avoided, which ensures the subsequent alignment of the first chip 10 and the second chip 20 to be reliable, thereby improving the performance of the semiconductor structure.

In an embodiment, the connecting the first chip 10 and the second chip 20 includes: melting the first connection group 132 and the second connection group 232 at the first temperature, such that the first chip 10 and the second chip 20 are connected, where the first temperature is lower than the melting points of the first conductor group 131 and the second conductor group 231. That is, at the first temperature, the first connection group 132 and the second connection group 232 are melted, while the first conductor group 131 and the second conductor group 231 are not melted. In this case, the conductive materials of the first conductive contact pad 13 and the second conductive contact pad 23 can be interpenetrated and fused at the interface, thus forming a pre-bonding structure.

In an embodiment, the connecting the first chip 10 and the second chip 20 further includes: boding the connected first chip 10 and the connected second chip 20 under an annealing condition at a second temperature, such that a bonding structure is formed after the first conductive contact pad 13 and the second conductive contact pad 23 are melted, where the first temperature is lower than the second temperature. The first conductive contact pad 13 and the second conductive contact pad 23 form a pre-bonding structure at the first temperature, so as to be bonded after being moved to an environment with the second temperature, which can avoid relative slippage between the first chip 10 and the second chip 20, thereby improving the yield of the semiconductor structure.

It should be noted that, the specific process of bonding the first chip 10 and the second chip 20 under the annealing condition at the second temperature is not limited. Reference can be made to the bonding method in the related art. The focus herein is that the first chip 10 and the second chip 20 have been pre-connected before bonding under the annealing condition at the second temperature.

In an embodiment, the first connection group 132 is formed on the first conductor group 131 through electroplating or printing; the second connection group 232 is formed on the second conductor group 231 through electroplating or printing.

It should be noted that, in an embodiment, the method of manufacturing a semiconductor structure is used for forming the semiconductor structure described above. For the materials and structures of the first chip 10 and the second chip 20 in the method of manufacturing a semiconductor structure, reference can be made to the specific description of the foregoing semiconductor structure, and details are not described herein again.

Those skilled in the art may easily figure out other implementations of the present disclosure after considering the specification and practicing the invention disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A semiconductor structure, comprising:
a first chip, wherein the first chip comprises a first substrate, a first conductive connection wire, and a first conductive contact pad, the first conductive contact pad is connected to the first conductive connection wire, the first conductive contact pad comprises a first conductor group and a first connection group, and a melting point of the first conductor group is higher than a melting point of the first connection group; and
a second chip, wherein the second chip comprises a second substrate, a second conductive connection wire, and a second conductive contact pad, the second conductive contact pad is connected to the second conductive connection wire, the second conductive contact pad comprises a second conductor group and a second connection group, a melting point of the second conductor group is higher than a melting point of the second connection group, the first conductor group is directly opposite to the second conductor group, and the first connection group is directly opposite to the second connection group, such that a bonding structure is formed between the first conductive contact pad and the second conductive contact pad;
wherein an end of the first conductive contact pad facing toward the second conductive contact pad is a first contact surface, an end of the second conductive contact pad facing toward the first contact surface is a second contact surface, an area occupied by the first conductor group on the first contact surface is larger than an area occupied by the first connection group on the first contact surface, and an area occupied by the second conductor group on the second contact surface is larger than an area occupied by the second connection group on the second contact surface;
wherein both the first conductive connection wire and the first conductive contact pad are located in the first substrate.

2. The semiconductor structure according to claim 1, wherein the first conductor group and the first connection group occupy the whole first contact surface, and the second conductor group and the second connection group occupy the whole second contact surface.

3. The semiconductor structure according to claim 2, wherein the first conductor group comprises only a first conductor, the first connection group comprises at least one of a second conductor or a first insulator; and
the second conductor group comprises only a third conductor, and the second connection group comprises at least one of a fourth conductor or a second insulator.

4. The semiconductor structure according to claim 3, wherein an area of the first contact surface is equal to an area of the second contact surface; and
the area occupied by the first conductor group on the first contact surface is equal to the area occupied by the second conductor group on the second contact surface.

5. The semiconductor structure according to claim 3, wherein an area of the first contact surface is not equal to an area of the second contact surface.

6. The semiconductor structure according to claim 2, wherein a peripheral outer edge of the first contact surface comprises at least one of a straight line or a curve, and a peripheral outer edge of the second contact surface comprises at least one of a straight line or a curve.

7. The semiconductor structure according to claim 1, wherein a volume occupied by the first conductor group in the first conductive contact pad is greater than a volume occupied by the first connection group in the first conductive contact pad; and
a volume occupied by the second conductor group in the second conductive contact pad is greater than a volume occupied by the second connection group in the second conductive contact pad.

8. The semiconductor structure according to claim 7, wherein one end of the first conductive connection wire is completely connected on the first conductor group; and
one end of the second conductive connection wire is completely connected on the second conductor group.

9. The semiconductor structure according to claim 8, wherein at least one of the first connection group comprises multiple first sub-connection sections, and a part of the first conductor group is clamped between adjacent first sub-connection sections; or
the second connection group comprises multiple second sub-connection sections, and a part of the second conductor group is clamped between adjacent second sub-connection sections.

10. The semiconductor structure according to claim 7, wherein the first conductor group comprises at least one of copper or tungsten, and the first connection group comprises at least one of bismuth, cadmium, tin, lead, dysprosium or indium;
the second conductor group comprises at least one of copper or tungsten, and the second connection group comprises at least one of bismuth, cadmium, tin, lead, dysprosium or indium; or
the first conductor group comprises at least one of copper or tungsten, and the first connection group comprises at least one of silicon dioxide, silicon oxide carbon, silicon nitride or silicon carbide nitride; the second conductor group comprises at least one of copper or tungsten, and the second connection group comprises at least one of silicon dioxide, silicon oxide carbon, silicon nitride or silicon carbide nitride.

11. The semiconductor structure according to claim 1, wherein the first conductive connection wire is a first through-silicon via; and the second conductive connection wire is a second through-silicon via.

12. The semiconductor structure according to claim 1, wherein a material of the first conductor group is the same as a material of the second conductor group.

13. The semiconductor structure according to claim 1, wherein a material of the first connection group is the same as a material of the second connection group.

14. The semiconductor structure according to claim 1, wherein both the first conductive connection wire and the first conductive contact pad are located in the first substrate.

15. The semiconductor structure according to claim 1, wherein a thickness of the first connection group is less than 1 μm, and a thickness of the second connection group is less than 1 um.

16. A method of manufacturing a semiconductor structure, comprising:

providing a first chip, wherein the first chip comprises a first substrate, a first conductive connection wire, and a first conductive contact pad, the first conductive contact pad is connected to the first conductive connection wire, the first conductive contact pad comprises a first conductor group and a first connection group, and a melting point of the first conductor group is higher than a melting point of the first connection group;

providing a second chip, wherein the second chip comprises a second substrate, a second conductive connection wire, and a second conductive contact pad, the second conductive contact pad is connected to the second conductive connection wire, the second conductive contact pad comprises a second conductor group and a second connection group, and a melting point of the second conductor group is higher than a melting point of the second connection group;

aligning the first chip with the second chip, such that the first conductor group is directly opposite to the second conductor group, and the first connection group is directly opposite to the second connection group; and connecting the first chip and the second chip;

wherein an end of the first conductive contact pad facing toward the second conductive contact pad is a first contact surface, an end of the second conductive contact pad facing toward the first contact surface is a second contact surface, an area occupied by the first conductor group on the first contact surface is larger than an area occupied by the first connection group on the first contact surface, and an area occupied by the second conductor group on the second contact surface is larger than an area occupied by the second connection group on the second contact surface;

wherein, both the second conductive connection wire and the second conductive contact pad are located in the second substrate.

17. The method of manufacturing a semiconductor structure according to claim 16, wherein the connecting the first chip and the second chip comprises:

melting the first connection group and the second connection group at a first temperature, such that the first chip and the second chip are connected;

wherein the first temperature is lower than the melting point of the first conductor group and the melting point of the second conductor group.

18. The method of manufacturing a semiconductor structure according to claim 17, wherein the connecting the first chip and the second chip further comprises:

boding a connected first chip and a connected second chip under an annealing condition at a second temperature, such that a bonding structure is formed between the first conductive contact pad and the second conductive contact pad;

wherein the first temperature is lower than the second temperature.

19. The method of manufacturing a semiconductor structure according to claim 16, wherein the first connection group is formed on the first conductor group through electroplating or printing; and the second connection group is formed on the second conductor group through electroplating or printing.

* * * * *